United States Patent [19]

Daud et al.

[11] Patent Number: 4,631,352
[45] Date of Patent: Dec. 23, 1986

[54] HIGH BAND GAP II-VI AND III-V TUNNELING JUNCTIONS FOR SILICON MULTIJUNCTION SOLAR CELLS

[75] Inventors: Taher Daud, La Crescenta; Akaram H. Kachare, La Canada, both of Calif.

[73] Assignee: The United States of America as represented by the Administrator of the National Aeronautics and Space Administration, Washington, D.C.

[21] Appl. No.: 809,975

[22] Filed: Dec. 17, 1985

[51] Int. Cl.$^4$ ............... H01L 31/06; H01L 27/14
[52] U.S. Cl. ............................................. 136/249
[58] Field of Search ........................... 136/249 TJ

[56] References Cited

U.S. PATENT DOCUMENTS

| | | | |
|---|---|---|---|
| 3,046,459 | 7/1962 | Anderson et al. | 357/12 |
| 4,128,843 | 12/1978 | Chiang | 357/30 |
| 4,179,702 | 12/1979 | Lamorte | 357/30 |
| 4,278,474 | 7/1981 | Blakeslee et al. | 136/249 |
| 4,295,002 | 10/1981 | Chappell et al. | 136/244 |
| 4,332,974 | 6/1982 | Fraas | 136/249 |
| 4,387,265 | 6/1983 | Dalal | 136/249 |
| 4,404,421 | 12/1983 | Fraas | 136/249 |
| 4,451,691 | 5/1984 | Fraas | 136/249 |
| 4,461,922 | 7/1984 | Gay et al. | 146/249 |
| 4,479,027 | 10/1984 | Todorof | 136/249 TJ |

OTHER PUBLICATIONS

P. D. Sparks et al., *Conference Record, 17th IEEE Photovolatic Specialists Conference* (1984), pp. 726–728.
M. S. Bae, R. V. D'Aiello, "P+/N High-Efficiency Silicon Solar Cells", Applied Physics Letters, vol. 31, No. 4, 15 Aug. 1977, pp. 285–287.

*Primary Examiner*—Aaron Weisstuch
*Attorney, Agent, or Firm*—Paul F. McCaul; John R. Manning; Thomas H. Jones

[57] ABSTRACT

A multijunction silicon solar cell of high efficiency is provided by providing a tunnel junction between the solar cell junctions to connect them in series, where the tunnel junction is comprised of p+ and n+ layers of high band-gap III-V or II-VI semiconductor materials that match the lattice structure of silicon, such as GaP (band-gap 2.24 eV) or ZnS (band-gap 3.6 eV), each of which has a perfect lattice match with silicon to avoid defects normally associated with lattice mismatch.

2 Claims, 2 Drawing Figures

HIGH BAND GAP II-VI AND III-V TUNNELING JUNCTIONS FOR SILICON MULTIJUNCTION SOLAR CELLS

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to silicon solar cells, and more particularly monolithic silicon multijunction solar cells with III-V or II-VI tunnel junctions to connect solar cells of a stack.

Silicon is the least expensive semiconductor material available for solar cells. Silicon solar cell conversion efficiency has been continuously improved from about 5% in 1956 to more than 16% at the present time. Improvements both in materials technology and in cell processing has been largely responsible for this. However, a compromise between shallower junctions and lower series resistance of the front diffused region soon reached its limits. (Losses in the diffused region as well as the metal grid are proportional to the square of the current). Similarly, a limit has been reached in a compromise between more absorption with thicker cells and more collection at the front junction. Such a compromise needs longer minority carrier diffusion lengths.

The quest for higher efficiency has led to stacking solar cells. Because of improvements in techniques of epitaxial silicon growth, with finer control of doping possible, a multilayered silicon structure of two or more p/n junctions can be produced with heavily doped n+/p+ tunnel junction between them acting as low resistance connections. The stack is characterized by high open circuit voltage, which is the sum of the open circuit voltages of the individual cells thus stacked.

One would think that heavily doped silicon layers could be used as tunneling junctions in multijunction silicon solar cells. However, analysis has shown that the interface recombination velocity at the silicon tunneling junction is greater than $10^4$ cm/sec, which degrades performance below that of a conventional monojunction silicon cell. To minimize this recombination loss, the present invention combines silicon (group IV semiconductor) with GaP (III-V) or ZnS (II-VI) compounds which are uniquely suited for the tunneling junction in the multijunction silicon solar cells.

Because of the technological advancements of silicon compared with III-V semiconductor compounds, a number of opto-electronic devices are made from silicon wafers. The present invention provides a viable high voltage source which has excellent compatibility with other devices fabricated on silicon chips. This compatibility may not be achievable with solar cells based on III-V compounds.

SUMMARY OF THE INVENTION

In accordance with the present invention, a multijunction silicon solar cell of high efficiency is provided by tunnel junctions between the solar cell junctions to connect them in series. The tunnel junctions are comprised of p+ and n+ layers of a high bandgap III-V or II-VI semiconductor material that matches the lattice structure of silicon, such as GaP (bandgap 2.24 eV) or ZnS (bandgap 3.6 eV), each of which has a perfect lattice match with silicon to avoid defects normally associated with lattice mismatch.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
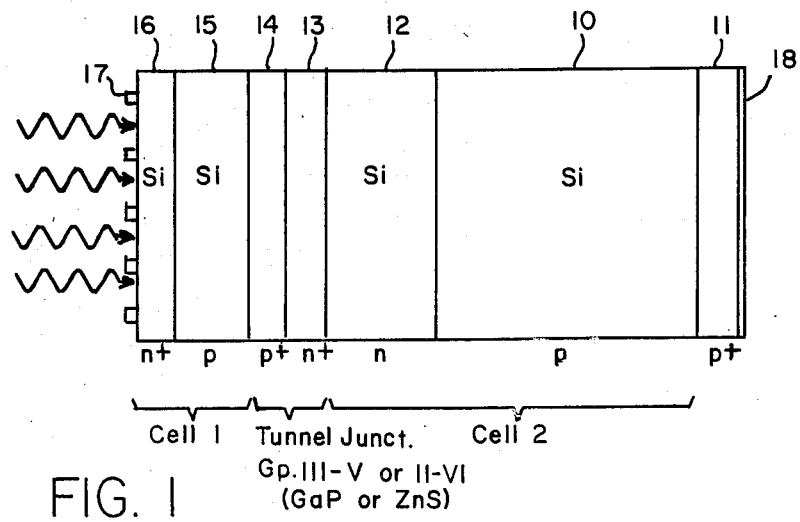
FIG. 1 illustrates schematically the geometry of a multijunction solar cell having a tunnel junction connecting the solar cell junctions in series.

The geometry of the multijunction solar cell applicable both to the prior art solar cells and the present invention is illustrated in FIG. 1 as a p substrate, 10, that is 200 μm thick, 1Ω-cm in resistivity, polished, and cleaned. All other layers of doped silicon, 11 through 16, are grown using Molecular Beam Epitaxy (MBE) requiring a substrate temperature of only 600°-650° C. That temperature is low enough to avoid any redistribution of dopants in the layers grown successively. A vaccum of $10^{-10}$ torr is used during all MBE processing.

A back contact layer 11 can be formed by thermal diffusion of boron with a surface concentration of $\sim 10^{20}$/cc and a junction depth (high-low) of about 0.5 μm, or it can be formed by MBE growth with Ga doping to $5\times10^{18}$/cc and a thickness of 0.5 to 1 μm. A 50 to 100 nm layer 12 of silicon, with an antimony (Sb) concentration of $\sim 10^{16}$ atoms/cc, is grown as an n layer which forms a junction $J_2$ for cell 2. For an all-silicon solar cell of the prior art configuration, the concentration is then increased to $10^{19}$/cc to form an n+ layer 13. This layer is made very shallow ($\sim$300 to 400 Å). Another very shallow layer 14 is then deposited with as high a Ga doping as possible (2 to $5\times10^{18}$/cc) to form a p+ layer. The n+ and p+ layers form a tunnel junction $J_t$ joining the rear cell 2 to a front cell 1. The doping concentration is reduced to $10^{16}$/cc to form the 4.5 μm thick p base layer 15 of cell 1. The junction $J_2$ of cell 1 is then formed using Sb doping concentration of $10^{19}$/cc for a 500 Å layer 16. This structure is then removed from the MBE system and standard techniques are employed to metalize (Al) the back surface and to provide front and back contacts 17 and 18 (Ti-Pd-Ag).

Figure 2:
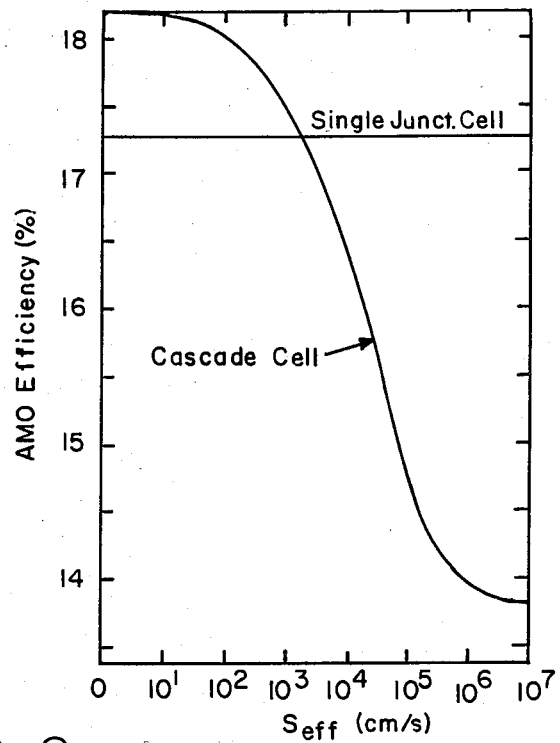
FIG. 2 illustrates in a graph the effect of imperfect reflections at the tunnel junction of the multijunction solar cell of FIG. 1 when the tunnel junction is made of silicon.

The tunnel junction acts as a low resistance connection between cells 1 and 2 but when the layers 13 and 14 are made of silicon, a large ($10^5$ cm/sec) interface recombination velocity, $S_{rv}$, at the tunnel junction degrades efficiency below that of a conventional single silicon junction cell indicated by data in the graph of FIG. 2. The graph is of calculated AMO (Air Mass Zero) efficiency as a function of $S_{eff}$ for the series connected cells, where $S_{eff}$ is defined as the effective surface recombination velocity at the p/p+ interface. For reference, the efficiency of a single cell is shown at 17.25%.

Multijunction solar cells of the same general geometry have been proposed for GaAs solar cells, using GaAs tunnel junctions for interconnections between cells, or other group III-V compound material, such as GaInP for a high band-gap cell of GaInP in front of a low band-gap cell of GaInAs, as shown in FIG. 3 of U.S. Pat. No. 4,179,702. Such a high band-gap tunnel junction improves the efficiency of the connection, and lattice mismatch between the tunnel junction and the two cells is minimized, but the materials used for the cells are more costly then silicon, and are not compatible with other devices fabricated in silicon.

The solution to the problem of maintaining high efficiency in stacked solar cell junctions and compatibility with silicon devices fabricated in a chip is to use a high band-gap III-V or II-IV semiconductor compound for the tunnel junction connecting the silicon solar cell junctions, as indicated in FIG. 1. GaP and ZnS have a lattice match with silicon which avoids defects normally associated with lattice mismatch. A multijunction solar cell made using MBE growth, or other suitable epitaxy growth technique, may thus be readily fabricated with a high band-gap tunnel junction between cells. A high band-gap material will form a high barrier to minority carrier diffusion to the p+/n+ interface of the tunnel junction. A WKB approximation (Wentzel-Kramers-Brillouin method) shows near zero probability of tunneling for the minority carriers at the Si/GaP or Si/ZnS barrier (p/p+). The WKB tunneling probability $T_t$ is calculated from the following equation $$T_t = \exp \frac{-4\sqrt{2m^*}\, E_g^{3/2}}{3qh\epsilon} \simeq \text{zero}$$

where
- $m^*$ (effective mass) $\simeq 0.2 \times 9.1 \times 10^{-31}$ kg
- $E_g$ (energy gap band) $= 1.2 \times 1.6 \times 10^{-19}$ joules
- $q$ (electric charge) $= 1.6 \times 10^{-19}$ coulomb
- $h$ (Planck's constant) $= 1.05 \times 10^{-34}$ j-sec
- $\epsilon$ (electric field) $= 6 \times 10^6$ V/meter This will reduce the recombination at that interface to less than $10^3$ cm/sec. In addition to good lattice match with silicon, such a high band-gap has a very low optical loss due to its wider band-gap.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A multijunction silicon solar cell comprising a plurality of p/n junction solar cells epitaxially grown in layers to receive solar energy in series through the n-type layer of each solar cell and having the p-type layer of one connected to the n-type layer of the next in series by a p+/n+ tunnel junction of III-V or II-VI semiconductor material of higher band-gap than silicon, and having a near perfect lattice match with silicon.

2. A multijunction silicon solar cell as defined in claim 1 wherein said high band-gap material is GaP of the III-V group or ZnS of the II-VI group.

* * * * *